(12) United States Patent
Roeven et al.

(10) Patent No.: US 11,297,276 B1
(45) Date of Patent: Apr. 5, 2022

(54) METHOD AND SYSTEM FOR HIGH SPEED SIGNAL PROCESSING

(71) Applicant: FEI Company, Hillsboro, OR (US)

(72) Inventors: Henricus Gerardus Roeven, Eindhoven (NL); Rob Braan, Eindhoven (NL); Bart Jozef Janssen, Eindhoven (NL); Jeroen Keizer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/039,620

(22) Filed: Sep. 30, 2020

(51) Int. Cl.
  *H04N 5/378* (2011.01)
  *H04N 5/359* (2011.01)
  *H04N 5/363* (2011.01)

(52) U.S. Cl.
  CPC ............. *H04N 5/378* (2013.01); *H04N 5/359* (2013.01); *H04N 5/363* (2013.01)

(58) Field of Classification Search
  CPC ........ H04N 5/378; H04N 5/359; H04N 5/363; H04N 5/355; H04N 5/357; H04N 5/3575
  See application file for complete search history.

(56) References Cited

U.S. PATENT DOCUMENTS

| | | | |
|---|---|---|---|
| 8,817,148 B2 | 8/2014 | Janssen et al. | |
| 2013/0229543 A1* | 9/2013 | Hashimoto | H04N 5/35545 348/222.1 |

* cited by examiner

*Primary Examiner* — Nicholas G Giles

(57) ABSTRACT

A method and system for acquiring data from a pixelated image sensor for detecting charged particles. The method includes reading a pixel voltage of one or more of the multiple pixels multiple times without resetting the image sensor and digitizing the pixel into a first number of bits. The camera outputs a digitized compressed pixel voltage in a second, less, number of bits. The maximum range of the digitized compressed pixel voltage is less than a maximum range of the pixel voltage.

20 Claims, 7 Drawing Sheets

US 11,297,276 B1

METHOD AND SYSTEM FOR HIGH SPEED SIGNAL PROCESSING

INCORPORATION BY REFERENCE

This application relates to U.S. application Ser. No. 13/645,725 filed on Oct. 5, 2012, titled "Method for acquiring data with an image sensor", by Janssen et al., which is incorporated herein by reference in its entirety and for all purposes.

FIELD OF THE INVENTION

The present description relates generally to methods and systems for data acquisition using a camera, and more particularly, to high speed camera readout and real-time signal processing of the readout data.

BACKGROUND OF THE INVENTION

A charged particle microscopy system may include a camera for detecting charged particles emitted from a sample, digitizing the detected raw signal, and outputting the digitized signal to an image processor for real-time signal processing. In order to increase the data acquisition speed, the microscopy system requires a short sensor response time, high speed sensor data readout, and real-time data processing and data storage. For cameras with pixelated image sensor, the pixels may need to be reset when the pixel voltage exceeding a predetermined level. One method to increase the readout speed of such pixelated image sensor is multi-frame correlative double sampling (mfCDS), disclosed in U.S. application Ser. No. 13/645,725 by Janssen et al, filed on Oct. 5, 2012, titled "Method for acquiring data with an image sensor". In mfCDS, multiple frames of raw data are readout from the image sensor before resetting the image sensor or a particular pixel of the image sensor. Particle counting can then be determined based on the difference of sequentially acquired pixel voltages. However, Applicant recognizes that the limited bandwidth within the camera and/or between the camera and the image processor may become the bottleneck for high speed signal processing.

SUMMARY

In one embodiment, a method for acquiring data from a camera including a pixelated image sensor for detecting charged particles comprises reading a pixel voltage of one or more pixels of the image sensor multiple times without resetting the image sensor; digitizing the pixel voltage into a first number of bits; and outputting a digitized compressed pixel voltage in a second, lower, number of bits, wherein a maximum range of the digitized compressed pixel voltage is less than a maximum range of the pixel voltage, and wherein the digitized compressed pixel voltage is generated by removing at least a most significant bit (MSB) of the digitized pixel voltage. In this way, pixel voltage at each pixel of the image sensor may be readout and transferred from the camera to the image processor in a lower number of bits without sacrificing data quality or precision. High speed signal readout and processing may be achieved with limited bandwidth within the camera and/or between the camera and the image processor.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION OF EMBODIMENTS

Figure 1:
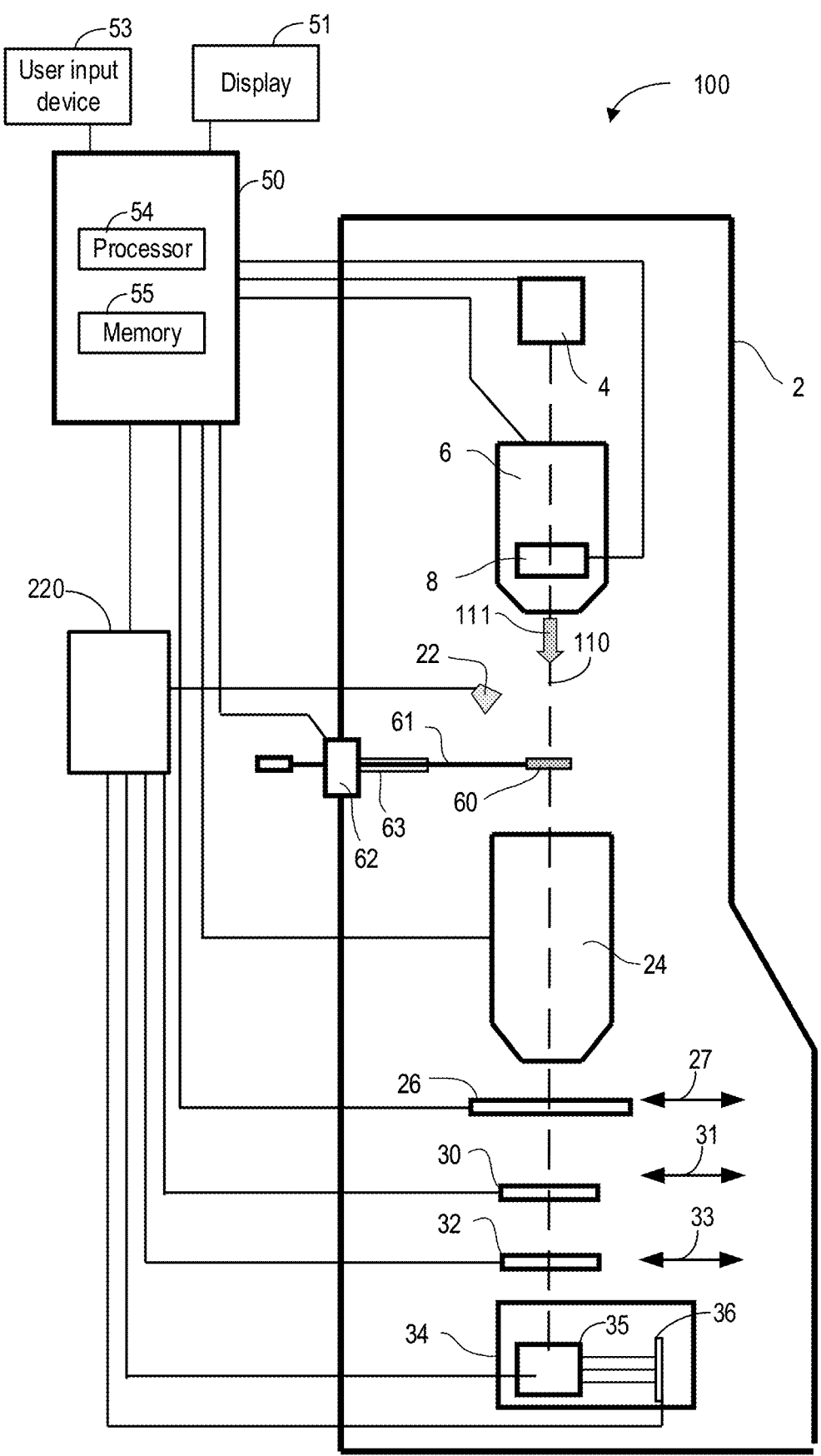
FIG. 1 shows a charged particle microscope.

The following description relates to systems and methods for data acquisition and data processing in a microscopy system, such as a charged particle microscope of FIG. 1. The charged particle microscope may include a source for generating charged particles. Responsive to irradiating a sample with the charged particles, various types of charged particles emitted from the sample are detected by different cameras or detectors.

The camera or detector may include a pixelated image sensor for converting charged particles impinging a pixel of the image sensor into the pixel voltage. The pixel voltage may be read out from the image sensor using the mfCDS method. In particular, the pixel voltage of a particular pixel is read out multiple times before resetting the pixel voltage to a reset value. The number of charged particles detected by the pixel may be determined based on the difference between sequential readouts of the pixel voltage. Using mfCDS, multiple frames can be readout before resetting the image sensor. The resetting noise is reduced by calculating the difference between the sequential readouts. Further, the maximum frame rate of image sensor readout may be increased by reducing the frequency of resetting the pixel voltage.

The pixel voltage read from the image sensor may be digitized by an analog to digital converter (ADC) and transferred from the camera to an image processor for further processing. Though high frame rate readout from the image sensor can be achieved using the mfCDS method, the data transfer rate (i.e. bandwidth) between the ADC and the readout electronics within the camera and/or the data transfer rate between the camera and the image processor may limit the overall data acquisition rate and data quality of microscopy system. In order to increase the frame rate of data received at the image processor, the bit depth (i.e. the number of bits) of the digitized pixel voltage for each pixel has to be reduced. However, reducing the bit depth may reduce data precision. Herein, precision of a digital signal is the value represented by the least significant bit (LSB) of the digitized signal.

Figure 2:
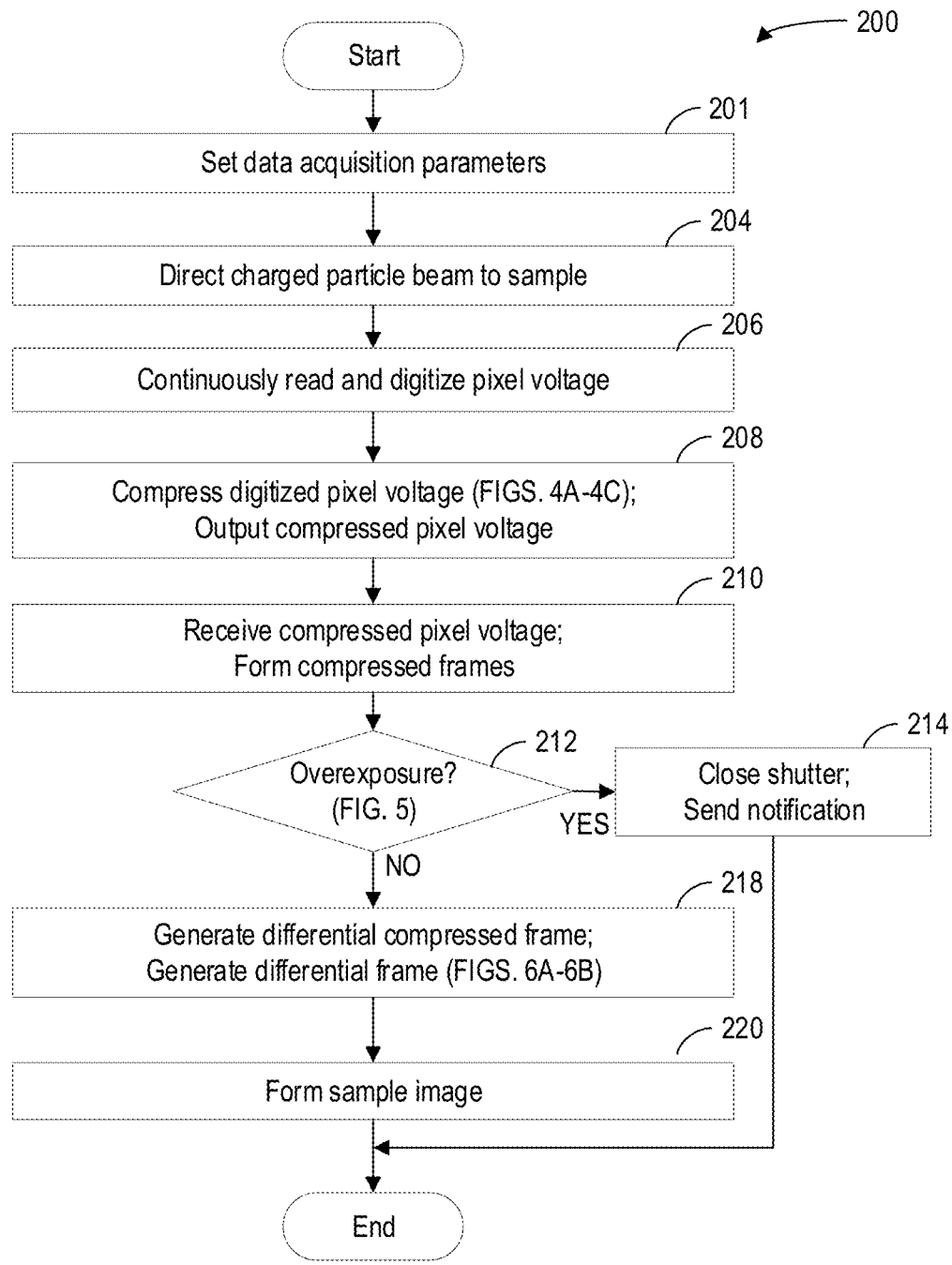
FIG. 2 is a flow chart of a method for acquiring data from a camera of the charged particle microscope of FIG. 1.
Figure 3:
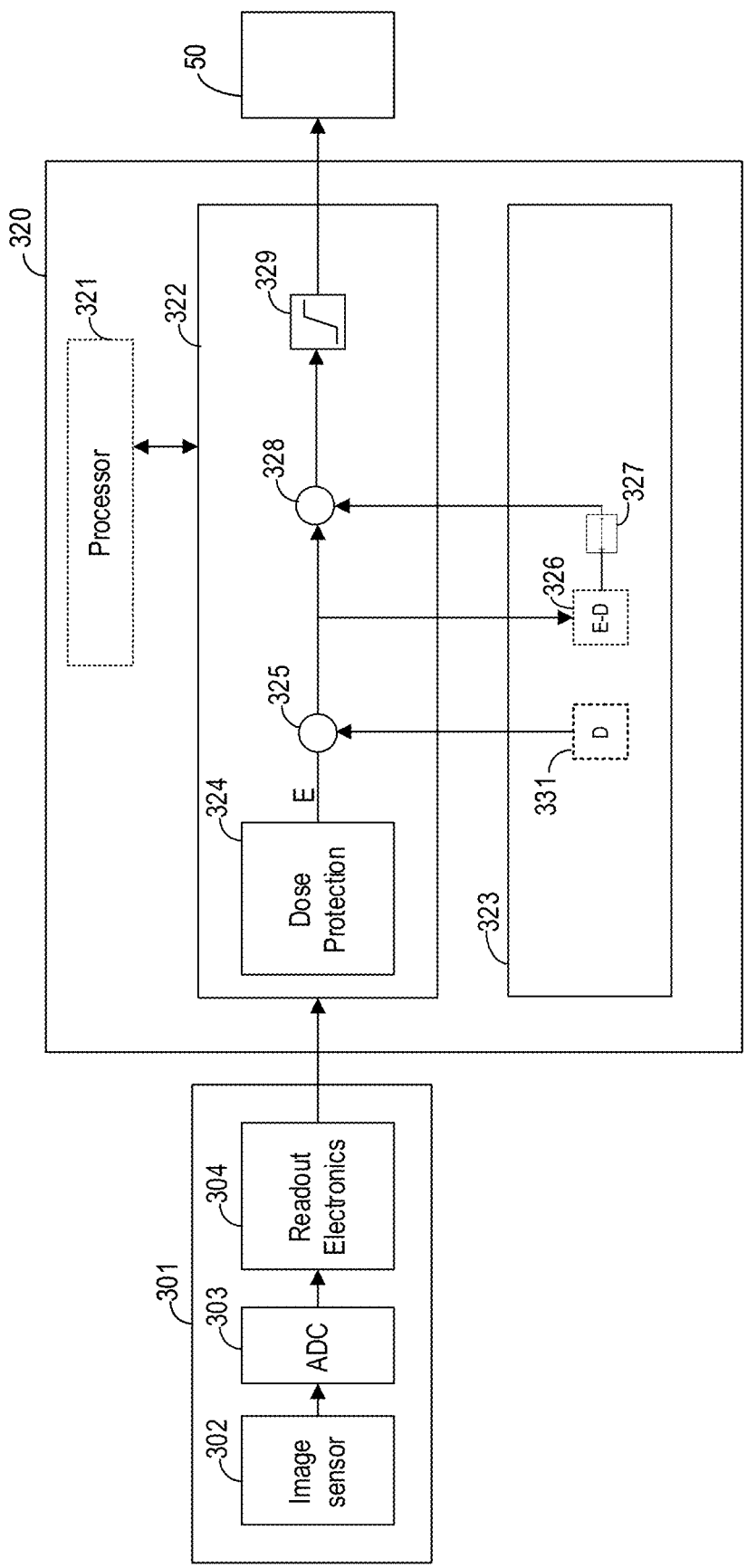
FIG. 3 illustrates the data flow of the method in FIG. 1.

In order to address the above issue, a method for high speed camera readout and real-time processing of the data received from the camera is presented in FIG. 2. The dataflow is illustrated in FIG. 3. Specifically, the pixel voltage of the image sensor is readout multiple times before sensor reset. The pixel voltage readout is compressed before being transferred from the camera to the image processor. The image processor receives the compressed pixel voltage from the camera, and generates a differential voltage between sequentially received compressed pixel voltages. A sample image may be formed based on the differential voltage. Between adjacent image sensor resets, the pixel voltage is approximately monotonic. That is, between sensor resets, the pixel voltage of each pixel is a monotonic signal superimposed with a noise. The noise amplitude is within 1% of the maximum amplitude of the pixel voltage. The sensor is reset before the pixel voltage amplitude exceeding the maximum pixel voltage amplitude. Because of the approximately monotonical change of pixel voltage between sensor resets and the change of the pixel voltage between sequential (or adjacent) image sensor readouts is within a threshold level, no information is lost even though the compressed pixel voltage is transferred between the camera and the image processor.

The maximum range of the compressed pixel voltage is less than the maximum range of the pixel voltage. The pixel voltage amplitude may be zero to the maximum pixel voltage amplitude. The pixel voltage may be compressed by subtracting a first threshold voltage from the pixel voltage responsive to the amplitude of the pixel voltage not less than the amplitude of the first threshold voltage and less than the amplitude of a second threshold voltage. The first threshold voltage may be determined based on the amount of change in the pixel voltage between adjacent pixel readouts. For example, the amplitude of the first threshold voltage is greater than the amount of change of the pixel value between adjacent pixel readouts. To further reduce the maximum range of the compressed pixel voltage, the pixel voltage may be further compressed by subtracting the second threshold voltage from the pixel voltage responsive to the amplitude of pixel voltage not less than the amplitude of the second threshold voltage and less than the amplitude of a third threshold voltage, and subtracting the third threshold voltage from the pixel voltage responsive to the pixel voltage not less than the amplitude of the third threshold voltage and less than the amplitude of a fourth threshold voltage. The first to fourth threshold voltages may be an analog voltage with the unit of volt. In one example, the pixel voltage of the image sensor increases responsive to charged particle impinging the pixel, and the threshold voltages are positive. In another example, the pixel voltage of the image sensor decreases responsive to charged particle impinging the pixel, and the pixel voltages are converted to approximately monotonically increased positive voltages before subtracting the positive threshold voltages. In yet another example, the pixel voltage of the image sensor decreases responsive to charged particle impinging the pixel, and the threshold voltages are negative. The compressed pixel voltage may be digitized into a lower number of bits than the pixel voltage readout from the image sensor. In this way, the pixel voltage is compressed or wrapped to a reduced range comparing to the range of the uncompressed pixel voltage. The range of the compressed voltage is not greater than the amplitude of the first threshold voltage.

Figure 4A:
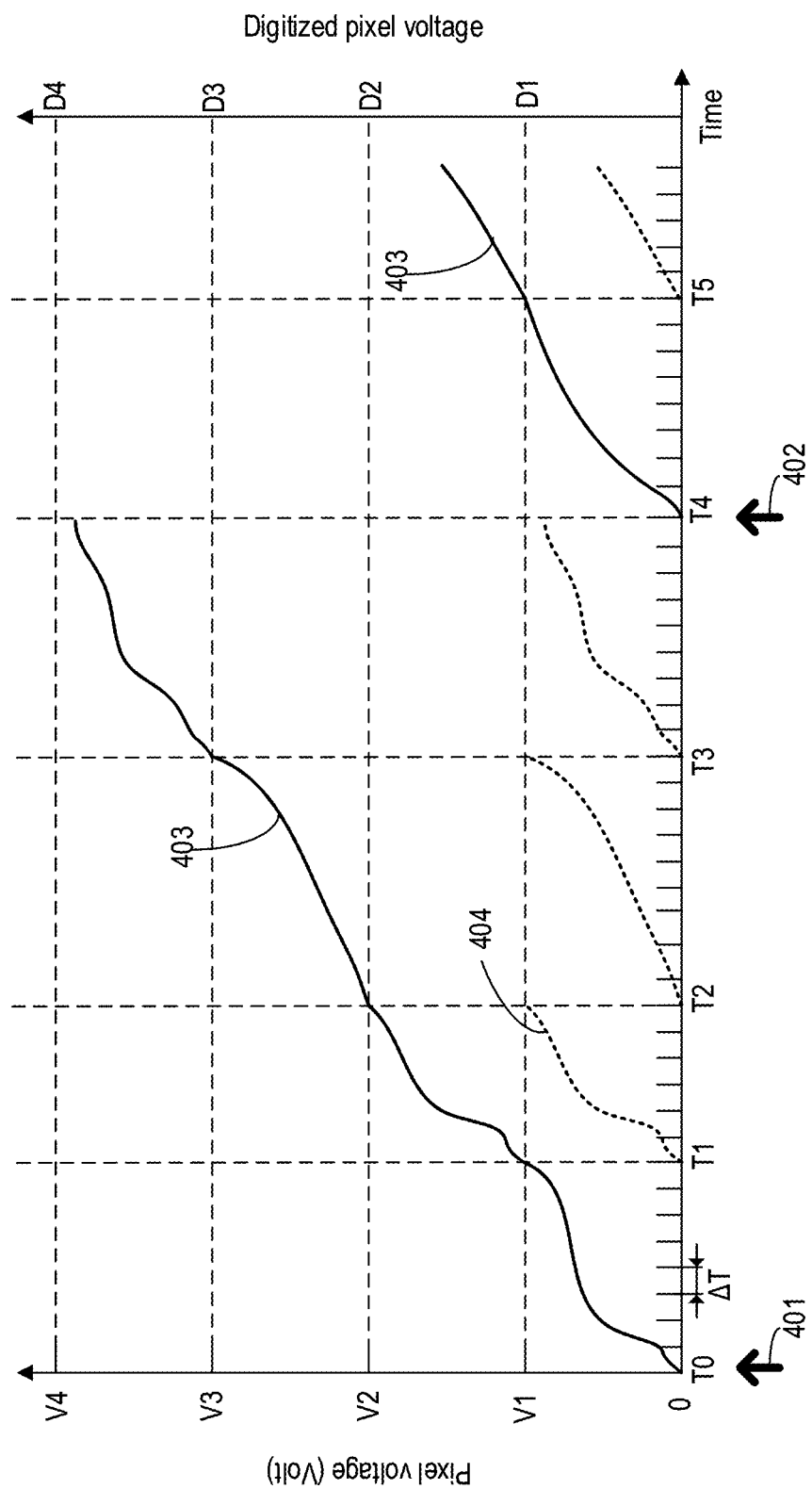
FIG. 4A illustrates a method for compressing the pixel voltage read from an image sensor.
Figure 4B:
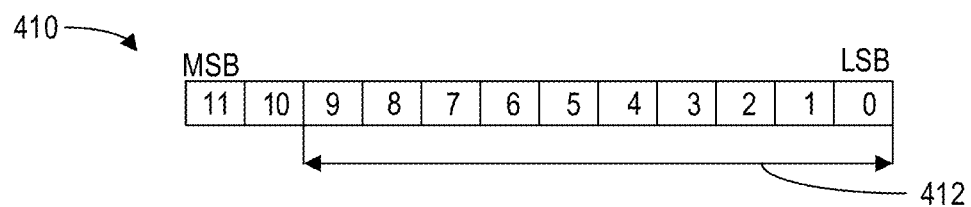
FIG. 4B illustrates an example for implementing the pixel voltage compression.
Figure 4C:
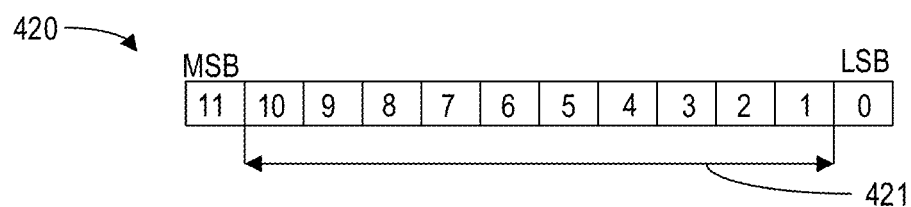
FIG. 4C illustrates another example for implementing the pixel voltage compression.

In another example, the pixel voltage readout from the image sensor is digitized into a first number of bits. The digitized pixel voltage is compressed to a digitized compressed pixel voltage having a second, lower, number of bits. The digitized pixel voltage and the digitized compressed pixel voltage have the same precision. The digitized pixel voltage may be unsigned. In one example, the digitized pixel voltage may be converted to be unsigned if the pixel voltage decreases approximately monotonically and is negative. The compression processes of subtracting threshold voltages from the pixel voltage may be implemented by removing one or more bits from the digitized pixel voltage. In one example, the digitized pixel voltage may be compressed by removing at least the MSB of the digitized pixel voltage. In another example, the digitized pixel voltage may be compressed by preserving a first bit to a second bit, and removing the rest bits, of the digitized first pixel voltage, wherein neither the first bit nor the second bit is the MSB. In one example, neither the first bit nor the second bit is the least significant bit (LSB). FIGS. 4A-4C illustrate example methods for compressing the pixel value.

Figure 6B:
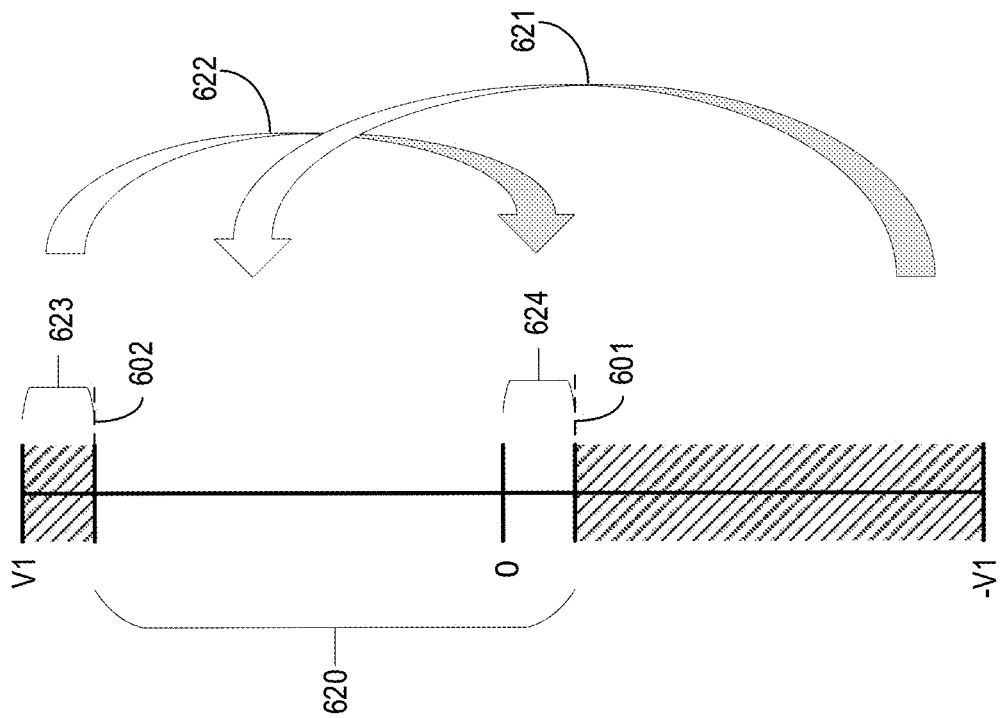
FIG. 6A and FIB. 6B illustrate a method for adjusting a pixel value of a differential compressed frame to a valid range.
Like reference numerals refer to corresponding parts throughout the several views of the drawings.
Figure 6A:
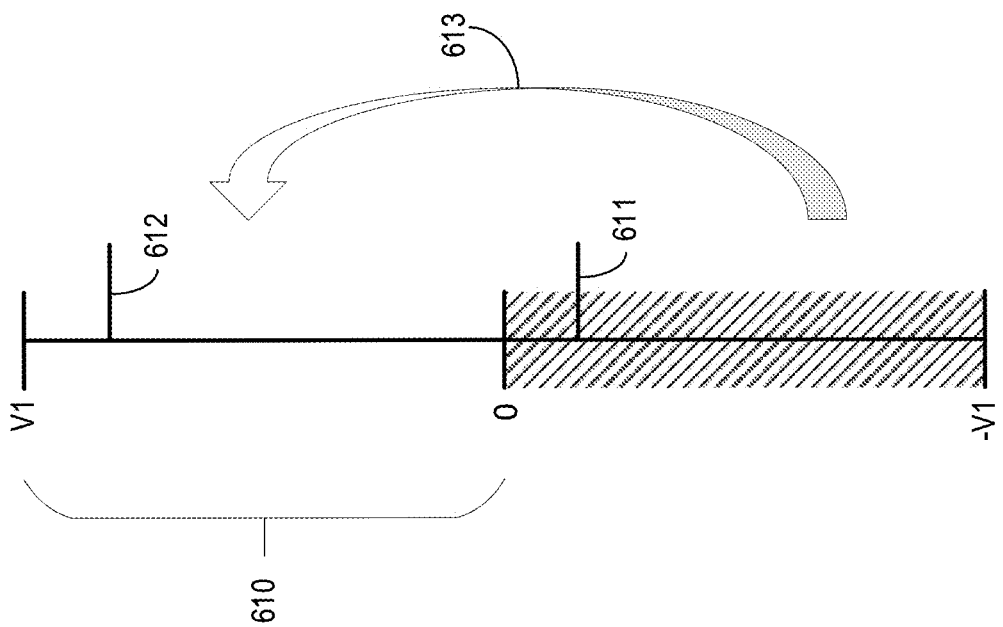

The camera continuously and repetitively reads out pixel voltages from each pixel in a region of the image sensor (i.e., a frame of pixel voltages) and sends the compressed pixel voltages or digitized compressed pixel voltages (i.e., compressed frame) to the image processor. Differential frames are reconstructed based on the difference of sequentially received compressed frames. Sample image may then be generated based on the differential frame. In one example, for each pixel, a differential compressed pixel voltage is the difference between a first compressed pixel voltage and a second compressed pixel voltage. The first compressed pixel voltage corresponds to the pixel voltage readout at a first time point, and the second compressed pixel voltage corresponds to the pixel voltage readout at a second time point, immediately after the first time point. There is no reset of the pixel or the image sensor between the first and second time points. As shown in FIGS. 6A-6B, the differential pixel voltage is reconstructed by adjusting the differential compressed pixel voltage to a valid range. The valid range is determined based on the first threshold voltage for compressing the pixel voltage and a predetermined noise amplitude. For example, the valid range is from a noise offset to a sum of the first threshold voltage amplitude and the noise offset. The noise offset is determined based on the noise amplitude, and may be negative or zero. Adjusting the differential compressed pixel voltage into the valid range includes adding the first threshold voltage amplitude to the differential compressed pixel voltage responsive to the differential compressed pixel voltage lower than the noise offset, and subtracting the first threshold voltage amplitude from the differential compressed pixel voltage responsive to the differential compressed pixel voltage greater than the sum of the first threshold voltage amplitude and the noise offset. The precision of the differential pixel voltage is the same as the digitized compressed pixel voltage.

Figure 5:
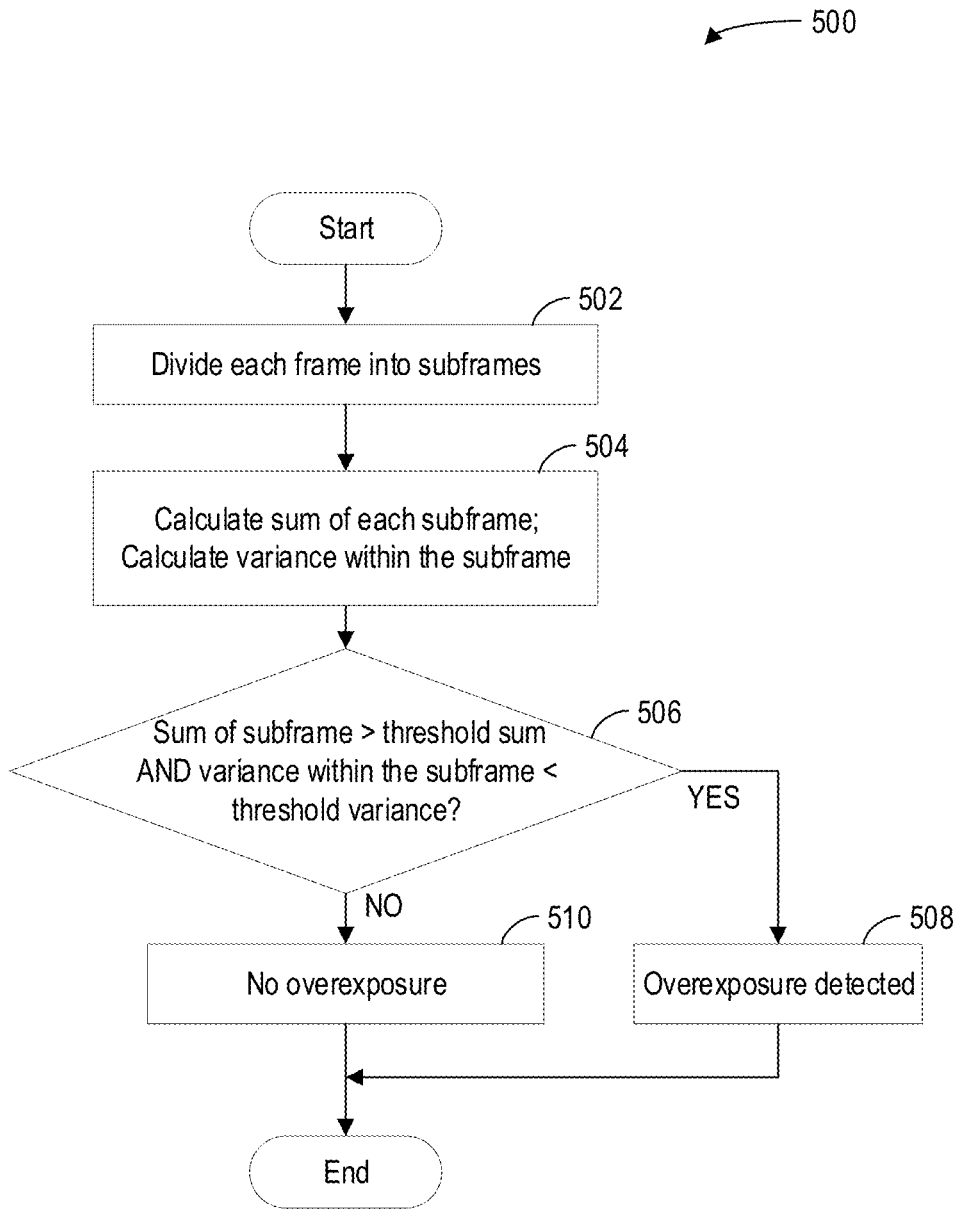
FIG. 5 is a flow chart of a method for detecting sensor overexposure.

In some example, before reconstructing the differential frames, a dark frame may be subtracted from the compressed frame to dark-correct the compressed frame. The dark correction process may be used to remove fixed patterns present in the image from sensor that is not exposed to radiation. Further, sensor overexposure may be detected based on the digitized compressed pixel voltage received by the image processor, as shown in FIG. 5.

In this way, the pixel voltage may be transferred between the camera and the image processor with a reduced number of bits. Because the characteristics of the pixel voltage, that are, approximate monotonicity and limited change over time, the difference between sequential pixel voltage readouts can be losslessly reconstructed at the image processor despite reduced dynamic range of signal transferred between the camera and the image processor.

Turning to FIG. 1, a transmission-type charged particle microscope 100, such as a transmission electron microscopy (TEM) system or scanning transmission electron microscopy (STEM) system, is shown. The microscope includes a vacuum enclosure 2 and a charged particle source 4 for producing a charged particle beam 111 that propagates along a primary axis 110 and traverses an electron-optical illuminator 6. The electron-optical illuminator 6 serves to direct/focus the charged particles onto a chosen part of sample 60 (which may, for example, be (locally) thinned/planarized). Also depicted is a deflector 8, which can be used to effect scanning motion of the beam 111.

The sample 60 is held on a specimen holder 61 that can be positioned in multiple degrees of freedom by a positioning device/stage 62, which moves a cradle 63 into which holder 61 is (removably) affixed; for example, the specimen holder 61 may comprise a finger that can be moved (inter alia) in the XY plane (see the depicted Cartesian coordinate system; typically, motion parallel to Z and tilt about X/Y will also be possible). Such movement allows different parts of sample 60 to be illuminated/imaged/inspected by the electron beam 111 traveling along primary axis 110 (in the Z direction) (and/or allows scanning motion to be performed, as an alternative to beam scanning). If desired, an optional cooling device (not depicted) can be brought into intimate thermal contact with the specimen holder 61, so as to maintain it (and the sample 60 thereupon) at cryogenic temperatures, for example.

The electron beam 111 will interact with the sample 60 in such a manner as to cause various types of "stimulated" radiation to emanate from the sample 60, including (for example) secondary electrons, backscattered electrons, X-rays and optical radiation (cathodoluminescence). If desired, one or more of these radiation types can be detected with detector 22, which might be a combined scintillator/photomultiplier or EDX (Energy-Dispersive X-Ray Spectroscopy) module, for instance; in such a case, an image could be constructed using basically the same principle as in scanning electron microscopy (SEM). However, alternatively or supplementally, one can study electrons that traverse (pass through) the sample 60, exit/emanate from it and continue to propagate (substantially, though generally with some deflection/scattering) along axis 110. Such a transmitted electron flux enters projection lens 24, which will generally comprise a variety of electrostatic/magnetic lenses, deflectors, correctors (such as stigmators), etc. In normal (non-scanning) TEM mode, projection lens 24 can focus the transmitted electron flux onto detector 26, which, if desired, can be retracted/withdrawn (as schematically indicated by arrows 27) so as to get it out of the way of axis 110. An image (or diffractogram) of (part of) the sample 60 will be formed by projection lens 24 on detector (such as screen) 26, and this may be viewed through a viewing port located in a suitable part of a wall of enclosure 2. The retraction mechanism for detector 26 may, for example, be mechanical and/or electrical in nature, and is not depicted here.

As an alternative to viewing an image on detector 26, one can instead make use of the fact that the depth of focus of the electron flux leaving projection lens 24 is generally quite large (e.g. of the order of 1 meter). Consequently, various other types of analysis apparatus can be used downstream of detector 26, such as TEM camera 30, STEM camera 32, and spectroscopic apparatus 34.

At TEM camera 30, the electron flux can form a static image (or diffractogram) that can be processed by image processor 220 and controller 50. When not required, camera 30 can be retracted/withdrawn (as schematically indicated by arrows 31) so as to get it out of the way of axis 110.

An output from STEM camera 32 can be recorded as a function of (X,Y) scanning position of the beam 111 on the sample 60, and an image can be constructed that is a "map" of output from camera 32 as a function of X,Y. Camera 32 may comprise a matrix of pixels. When not required, camera 32 can be retracted/withdrawn (as schematically indicated by arrows 33) so as to get it out of the way of axis 110 (although such retraction would not be a necessity in the case that camera 32 is a donut-shaped annular dark field camera, for example; in such a camera, a central hole would allow flux passage when the camera was not in use).

In addition to imaging using cameras 30 and/or 32, one can also invoke spectroscopic apparatus 34, which could be an EELS module, for example. The EELS module includes a spectrometer 35 for dispersing the charged particles based on the particle energy and a detector/camera 36 for capturing the spectrum.

It should be noted that the order/location of detectors 26, 30, 32, 34 and 36 is not strict, and many possible variations are conceivable. For example, spectroscopic apparatus 34 can also be integrated into the projection lens 24.

The controller 50 is connected to various illustrated components via control lines. The controller comprises a processor 54 and non-transitory memory 55. Instructions may be stored in the non-transitory memory 55, when executed, causes the controller 50 to provide a variety of functions, such as synchronizing actions, providing setpoints, processing signals, performing calculations, receiving operator input from user input device 53 and displaying messages/information on display device 51. The controller 50 may be (partially) inside or outside the enclosure 2, and may have a unitary or composite structure, as desired.

One or more detectors 22 and 26, cameras 30 and 32, and spectroscopic apparatus 34 may be electrically connected with image processor 220. The image processor may include a processor, a memory, and one or more Field-programmable gate arrays (FPGAs). Embedded software may be run in the image processor to process image data received from the cameras and/or detectors at high frame rate. Processed data from the image processor may be transferred from the image processor to the controller for further processing. For example, the controller generates sample images based on the data received from the image processor. The cameras and/or detectors may have separate image processors or a shared image processor. In one embodiment, the image processor and the controller may be integrated together as one component. In another embodiment, the image processor may be integrated with the camera.

Though a transmission type electron microscopy is described by way of example, it should be understood that the imaging system may be other types of charged particle microscopy system, such as a SEM or a focused ion beam combined with scanning electron microscopy (FIB-SEM). The charged particle may be electron, ion, or x-ray. One or more of the detectors or cameras, such as detectors 22 and 36, cameras 30 and 32, may include one or more image sensors with multiple pixels. The pixelated image sensor may be operated according to the methods disclosed below.

FIG. 2 shows method 200 for reading and processing data acquired by a camera including at least a pixelated image sensor. The camera may detect charged particles emitted from a sample in a microscope, such as the charged particle microscope 100 of FIG. 1. The dataflow among components of the microscope while executing method 200 is shown in FIG. 3. The camera data is read out utilizing the mfCDS method combined with data compression to increase the transfer rate of frames within the camera and from the camera to the image processor.

At 201, the data acquisition parameters of the microscope are set. The data acquisition parameters may include one or more of the dose of the charged particle beam at the sample plane, the imaging/scan area, the data readout rate at the image sensor, and the number of frames N readout between adjacent image sensor reset. The number of frames N between adjacent sensor resets may be determined based on an estimated pixel voltage change between adjacent pixel voltage readouts and the full-well capacity of the pixel. For example, the pixel of the image sensor is reset before reaching a predetermined maximum pixel voltage amplitude. The maximum pixel voltage amplitude is lower than the full-well capacity of the pixel. The pixel voltage change between adjacent pixel voltage readouts may be estimated based on the dose of the charged particle beam and the sample type.

At 204, the charged particle beam is directed to the sample. Responsive to the irradiation of the charged particles, various types of charged particles, such as the secondary electrons and the x-ray, are emitted from the sample. The multiple cameras (or detectors) in the microscope sense the emitted charged particles. For example, the cameras may include one or more of the TEM camera, the STEM camera or detector, the EDX detector, and the detector in the spectroscopic apparatus for sensing the EELS spectra. The camera includes a pixelated image sensor. The pixel voltage of a particular pixel changes approximately monotonically responsive to one or more charged particles impinging the pixel.

At 206, the pixel voltages are read out at the frequency determined at step 201 from the image sensor and digitized into a first number of bits. In one example, the pixel voltages of multiple pixels of the image sensor are read out according to a predetermined pattern to form a frame of pixel voltage. During image sensor readout, the image sensor is read out repetitively at the frame rate determined at step 201. After consecutively acquiring N frames, the image sensor is reset by resetting the pixel voltage of each pixel to a reset voltage. The reset voltage may be different for each reset. For each pixel of the multiple pixels, the pixel voltage is readout once during each frame readout. The pixel voltage of each pixel of the multiple pixels is repetitively readout N times before resetting the image sensor.

At 208, the pixel voltage is compressed, and the compressed pixel voltage is output to the image processor. In one example, the compressed pixel voltage may be digitized and transferred to the image processor. In another example, the pixel voltage is digitized before being compressed. The digitized compressed pixel voltage has a second number of bits, lower than the first number of bits of the digitized pixel voltage. The pixel voltage is compressed to a range less than the maximum range of the pixel voltage. The maximum range of the compressed pixel voltage is not greater than a first threshold voltage amplitude. In one example, the first threshold voltage is subtracted from the pixel voltage responsive to the amplitude of the pixel voltage not less than the amplitude of the first threshold voltage and less than the amplitude of a second threshold voltage. In another example, the digitized pixel voltage is compressed by removing at least the MSB. The first threshold voltage can be presented by a number of bits lower than a number of bits used for representing the maximum of the pixel voltage.

As shown in FIG. 3, in one example configuration, camera 301 includes image sensor 302, ADC 303, and readout electronics 304. The pixel voltage read from the image sensor 302 is digitized into the first number of bits by the ADC, and then compressed to the second number of bits. The readout electronics 304 may control the timing of data readout and outputs the compressed digitized pixel voltage to image processor 320.

FIGS. 4A-4C illustrate the process of compressing the pixel voltage when the pixel voltage increases responsive to charged particles impinging the pixel. The y-axis of FIG. 4A is the pixel voltage or the corresponding digitized pixel voltage of a particular pixel of the image sensor. The x-axis represents time. Time increases as indicated by the arrow. The solid plot 403 is the uncompressed pixel voltage readout from the image sensor. The uncompressed pixel voltage may be an analog signal or a digital signal. The dashed plot 404 is the compressed pixel voltage. At T0, the image sensor is reset. As a result, the pixel voltage is reset to a reset voltage. Herein, the reset voltage is zero. In other examples, the reset voltage may be a non-zero value. The reset voltage may vary upon each reset, therefore introduce a reset noise. From T0, as more charged particles impinging the pixel, the pixel voltage 403 increases from T0 to T4. At T4, the image sensor is reset again. Arrows 401 and 402 indicate the image sensor reset event. The pixel voltage is readout at a frequency of $1/\Delta T$. In other words, the image sensor is readout at a frame rate of $1/\Delta T$. From T0 to T1, the pixel voltage 403 is between the reset voltage and the first threshold voltage V1, and the compressed pixel voltage 404 equals the pixel voltage 403. From T1 to T3, responsive to the pixel voltage 403 not less than the first threshold voltage V1 and less than the second threshold voltage V2, the compressed pixel voltage 404 equals the pixel voltage 403 subtracting the first threshold voltage V1. The second threshold voltage V2 is twice of the first threshold voltage V1. From T2 to T3, responsive to the pixel voltage 403 not less than the second threshold voltage V2 and less than the third threshold voltage V3, the compressed pixel voltage 404 equals the pixel voltage 403 subtracting the second threshold voltage V2. The third threshold voltage V3 is three times of the first threshold voltage V1. From T3 to T4, responsive to the pixel voltage 403 not less than the third threshold voltage V3 and less than the fourth threshold voltage V4, the compressed pixel voltage 404 equals the pixel voltage 403 subtracting the third threshold voltage V3. The fourth threshold voltage V4 is four times of the first threshold voltage V1. At T4, since N frames have been acquired from previous reset at T0, the pixel voltage is reset again to the reset voltage. From T4 to T5, since the pixel voltage 403 is lower than the first threshold voltage, the pixel voltage 403 is the same as the compressed pixel voltage 404. After T5, as the pixel voltage 403 increases to be above V1 and lower than V2, the compressed pixel voltage 404 equals the pixel voltage 403 subtracting V1. As such, the compressed pixel voltage 404 is between zero and V1. For digitized signals, the compression process illustrated in FIG. 4A may reduce the bit depth of the digitized compressed pixel voltage by 2 bits from the bit depth of the digitized pixel voltage. For example, the digitized pixel voltage has 12 bits, and the digitized compressed pixel voltage has 10 bits. The first to fourth threshold voltages are 1024, 2048, 3072, and 4096, respectively. Value aliasing is introduced to the compressed pixel voltage through the compression. For example, pixel voltages between T1-T2 are aliased with (therefore not distinguishable from) pixel voltages between T0-T1. The value aliasing can be corrected or resolved in the image processor, by adjusting the pixel value of the differential compressed frame to the valid range.

If the pixel voltage is digitized, the compressed digitized pixel voltage may be generated by preserving a first bit to a second bit, and removing the rest bits, of the digitized first pixel voltage. The neither the first bit nor the second bit is the MSB. In one example, the subtraction of threshold voltages from the pixel voltage may be achieved by removing one or more bits from the side of the MSB, as shown in FIG. 4B. As an example, the digitized pixel voltage 410 has 12 bits. The compression illustrated in FIG. 4A may be implemented by removing 2 bits from the MSB side. The digitized compressed pixel voltage is the 10 bits from the LSB side as shown by 412. As such, in FIG. 4A, D1 is 1024, D2 is 2048, D3 is 3072, and D4 is 4096.

In another example, the subtraction of threshold voltages from the pixel voltage may be achieved by removing one or more bits from both the MSB side and the LSB side, as shown in FIG. 4C. As an example, the digitized pixel voltage 410 has 12 bits. The digitized compressed pixel voltage is bit 1 to bit 10 as shown by 421. In this example, the signal precision of the digitized compressed pixel voltage is reduced comparing to the digitized pixel voltage in order to increase the data transfer rate.

FIG. 4A shows uncompressed pixel voltage increasing monotonically between consecutive sensor resets. In another embodiment, the uncompressed pixel voltage read out form the image sensor decreases monotonically between consecutive resets. In one example, the pixel voltage may be compressed by subtracting negative threshold voltages from the uncompressed pixel voltage. In another example, the uncompressed pixel voltage may be converted to monotonically increased pixel voltage, such as by subtracted from a threshold pixel voltage, before being compressed as shown in FIGS. 4A-4C.

Turning back to FIG. 2, at 210, the image processor receives the compressed pixel voltage or digitized compressed pixel voltage from the camera and forms compressed frames with the compressed pixel voltage. In one example, as shown in FIG. 3, the image processor 320 may include one or more FPGAs 322 and memory 323. The FPGAs 322 have direct memory access to memory 323. Image processor 320 may optionally include a processor 321 for controlling the data/image processing within the FPGAs 322.

At 212, sensor overexposure is determined based on the compressed frame. The sensor overexposure may be determined based on the pixel value and the variance of the pixel values of a compressed frame. Dose protection block 324 of FIG. 3 represents the process of determining the sensor overexposure. Details of overexposure detection are presented in FIG. 5. If sensor overexposure is detected, at 214, method 200 may prevent the charged particles from reaching the image sensor, for example, by closing a shutter. The method 200 may send out notification to the operator indicating sensor overexposure. The method 200 may further adjust the data acquisition parameters of the current image session or stop the current image session. If the sensor overexposure is not detected, method 200 moves to 218.

At 218, a differential compressed frame is generated by subtracting the compressed frame from the previously acquired compressed frame. The pixel values of the differential compressed frame are then adjusted to a valid range. For example, a differential compressed frame is obtained by subtracting a first compressed frame acquired at a first time point t1 from a second compressed frame acquired at a second time point t2, immediately after acquiring the first compressed frame, that is $E_{t2}-E_{t1}$.

Step 218 may optionally include dark correcting the differential compressed frame before the subtraction. That is, the differential compressed frame is generated by subtracting sequentially acquired dark-corrected compressed frames. For example, as shown in FIG. 3, a dark frame 331 stored in memory 323 may be optionally subtracted from the compressed frame at 325 to generate a dark-corrected compressed frame 326. The dark-corrected compressed frame 326 is temporarily stored in memory 323. The dark-corrected compressed frame 326 is also sent to 328 to subtract the previously saved compressed frame. After a delay 327, upon receiving the next dark-corrected compressed frame, the dark-corrected compressed frame 326 is subtracted from the next dark-corrected compressed frame at 328 to generate a differential compressed frame.

The pixel value of the differential compressed frame is adjusted to the valid range at block 329 of FIG. 3. The valid range is determined based on a predetermined noise amplitude and the first threshold voltage used for compressing the pixel voltage at 208 of FIG. 2. The noise may include one or more sensor dark noise, sensor thermal noise, sensor readout noise, and sensor quantization noise. The noise amplitude may be determined a priori from inspection of image frames acquired without irradiation. For example, the noise amplitude is determined based on the standard deviation of the pixel values in the image frame acquired without irradiating the sample with the charged particle beam. A noise offset is determined based on the noise amplitude. The noise offset may be the negative of the noise amplitude. In one example, the valid range is from the noise offset to the sum of the first threshold voltage and the noise offset, wherein the noise offset is non-positive. If the pixel value is less than the noise offset, the first threshold voltage is added to the pixel value. If the pixel value is greater than the sum of the first threshold voltage and the noise offset, the first threshold voltage is subtracted from the pixel value. The first threshold voltage is the pixel voltage $V_1$ or the digitized pixel voltage $D_1$ used for compressing the pixel voltage at 208.

FIG. 6A illustrates adjusting the pixel value of the differential compressed frame to the valid range when there is no noise or zero noise. Because the compressed pixel voltage is from zero to the first threshold voltage, the pixel value of the differential compressed frame (that is, the difference between two compressed pixel voltage) is from the negative first threshold voltage $-V_1$ to the first threshold voltage $V_1$. The valid range 610 is from zero to $V_1$. If the pixel value is within the invalid range (that is, outside of the valid range 610) as indicated by the shaded area, the pixel value is adjusted into the valid range by adding the first threshold voltage to the pixel value. For example, pixel value 611 is adjusted to pixel value 612. As such, pixel values in the invalid range are moved to the valid range as indicated by arrow 613.

FIG. 6B illustrates adjusting the pixel value of the differential compressed frame to the valid range when noise is present in the pixel voltage. The noise offset 601 is negative. The valid range 620 is from the noise offset 601 to the sum 602 of the first threshold voltage $V_1$ and the noise offset 601. The shaded areas indicate invalid range. If the pixel value is from $-V_1$ to noise offset 601, the first threshold voltage $V_1$ is added to the pixel value, so that the pixel value is moved to the range from 0 to sum 602, as indicated by arrow 621. If the pixel value is from sum 602 to $V_1$, the first threshold voltage $V_1$ is subtracted from the pixel value. As the result, pixel value in range 623 is moved to range 624, as indicated by arrow 622.

At 220, sample image is formed based on the differential image. As shown in FIG. 3, the differential image is transferred from the image processor 320 to controller 50 for generating the sample image. Step 220 may include pre-processing the differential image before forming the sample image.

In this way, by reading out data from the camera at a bit depth lower than the bit depth for digitizing the image sensor readout. The camera may be operated at a maximum frame rate for reading out the sensor data, and the overall frame rate for data acquisition can be increased. The compression of pixel voltage can be executed at high speed by removing one or more bits from the MSB of the digitized pixel voltage. The change in pixel voltage during sequential image sensor readout can be losslessly reconstructed by adjusting the pixel value of the compressed differential frame to the valid range. Note that operations described sequentially herein may in some cases be rearranged or performed concurrently.

FIG. 5 shows method 500 for detecting sensor overexposure based on the compressed frames from camera output. The sensor overexposure may be detected based on the amount and variance of the pixel values of the compressed frame. In one example, the overexposure is determined based on one or more compressed frames acquired immediately after a sensor reset.

At 502, each compressed frame is divided into multiple subframes, each subframe including one or more pixels. The subframes may overlap with each other.

At 504, the sum and variance of all pixel values in the subframes are calculated and compared with a threshold sum at a threshold variance, respectively, at 506. In one example, the variance may the mathematical variance of the pixel values in the subframe. In another example, the variance may be calculated through other simplified approximate method. The threshold sum may be determined based on the number of pixels for each subframe, the full-well capacity of each pixel, and the number of frames after the most immediate sensor reset. The threshold variance may be determined by measuring the pixel values with actual deliberate (non-damaging) overexposure. If the sum of all pixel values of any subframe is greater than the threshold sum and the variance of the subframe is lower than the threshold variance, overexposure is detected at 508. Otherwise, no overexposure is detected at 510.

The technical effect of compressing the pixel voltage read out from the image sensor is to achieve high frame rate of data transfer even when the bandwidth between the ADC and the readout electronics and/or the bandwidth between the camera and the image sensor is limited. The technical effect of compressing the pixel voltage by removing one or more bits from the MSB of the digitized pixel voltage is that the compression can be implemented at a high speed. The technical effect of generating the differential frame based on sequentially acquired compressed frame is that the change in pixel voltage responsive to charged particles impinging the sensor is determined. The technical effect of correcting the range of the differential compressed frame to obtain the differential frame is that the aliasing due to compression is corrected. The precision of the digitized compressed pixel voltage and the pixel value in the differential frame are the same.

In one presentation, a method for acquiring data from a camera including a pixelated image sensor for detecting charged particles comprises receiving a first and a second digitized compressed pixel voltages from the camera; determining a differential compressed pixel voltage by calculating a difference between the first digitized compressed pixel voltage and the second digitized compressed pixel voltage; generating a differential pixel voltage by adjusting the differential compressed pixel voltage to a valid range determined by a predetermined noise offset and a first threshold voltage; and forming an image of the sample based on the differential pixel voltage.

In another presentation, a camera for detecting charged particles comprises an image sensor and one or more ADCs, wherein the camera is configured to: read a pixel voltage of one or more pixels of the image sensor multiple times without resetting the image sensor; digitize the pixel voltage into a first number of bits; and output a digitized compressed pixel voltage in a second, lower, number of bits, wherein a maximum range of the digitized compressed pixel voltage is less than a maximum range of the pixel voltage, and wherein the digitized compressed pixel voltage is generated by removing at least a most significant bit (MSB) of the digitized pixel voltage.

In one embodiment, a method for acquiring data from a camera including a pixelated image sensor for detecting charged particles, comprises reading a pixel voltage of one or more pixels of the image sensor multiple times without resetting the image sensor; digitizing the pixel voltage into a first number of bits; and outputting a digitized compressed pixel voltage in a second, lower, number of bits, wherein a maximum range of the digitized compressed pixel voltage is less than a maximum range of the pixel voltage, and wherein the digitized compressed pixel voltage is generated by removing at least a most significant bit (MSB) of the digitized pixel voltage. In a first example of the method, the digitized pixel voltage is unsigned. A second example of the method optionally includes the first example and further includes for each pixel of the one or more pixels of the image sensor, sequentially receiving a first digitized compressed pixel voltage and a second digitized compressed pixel voltage; determining a differential compressed pixel voltage by calculating a difference between the first digitized compressed pixel voltage and the second digitized compressed pixel voltage; and generating a differential pixel voltage by adjusting the differential compressed pixel voltage to a valid range, wherein the valid range is determined based on a predetermined noise offset and the maximum range of the digitized compressed pixel voltage. A third example of the method optionally includes one or more of the first to the second examples, and further includes, wherein the valid range is from the noise offset to a sum of a threshold voltage and the noise offset, and the threshold voltage is determined based on the maximum range of the digitized compressed pixel voltage. A fourth example of the method optionally includes one or more of the first to the third examples, and further includes, wherein adjusting the differential compressed pixel voltage to the valid range includes adding the threshold voltage to the differential compressed pixel voltage responsive to the differential compressed pixel voltage lower than the noise offset, and subtracting the threshold voltage from the differential compressed pixel voltage responsive to the differential compressed pixel voltage greater than the sum of the threshold voltage and the noise offset. A fifth example of the method optionally includes one or more of the first to the fourth examples, and further includes, wherein the second number of bits is determined based on a maximum range of change in the pixel value between sequential readouts. A sixth example of the method optionally includes one or more of the first to the fifth examples, and further includes, wherein the digitized compressed pixel voltage has the same signal precision as the digitized pixel voltage. A seventh example of the method optionally includes one or more of the first to the sixth examples, and further includes, wherein the digitized compressed pixel voltage is generated by further removing one or more bits from a least significant bit side of the digitized pixel voltage. An eighth example of the method optionally includes one or more of the first to the seventh examples, and further includes detecting image sensor overexposure based on the digitized compressed pixel voltage of the one or more pixels of the image sensor.

In one embodiment, a method for acquiring data from a camera including a pixelated image sensor for detecting charged particles, comprises repetitively reading a pixel voltage of a pixel of the image sensor without resetting the image sensor; compressing the pixel voltage into a compressed pixel voltage, wherein the compressed pixel voltage is a difference between the pixel voltage and a first threshold voltage responsive to an amplitude of the pixel voltage not less than an amplitude the first threshold voltage and less than an amplitude of a second threshold voltage, and wherein a maximum range of the compressed pixel voltage is not greater than the amplitude of the first threshold voltage, and the maximum range of the compressed pixel voltage is lower than a maximum range of the pixel voltage; digitizing the compressed pixel voltage; and outputting the digitized compressed pixel voltage. In a first example of the method, the method further includes, wherein compressing the pixel voltage further includes subtracting the second threshold voltage from the pixel voltage responsive to the amplitude of the pixel voltage not less than the amplitude of the second threshold voltage and less than an amplitude of a third threshold voltage. A second example of the method optionally includes the first example and further includes wherein the second threshold voltage is two times of the first threshold voltage. A third example of the method optionally includes one or more of the first to the second examples, and further includes resetting the image sensor after reading the pixel voltage of the pixel a predetermined number of times. A fourth example of the method optionally includes one or more of the first to the third examples, and further includes resetting the image sensor in response to the amplitude of the pixel voltage greater than a maximum amplitude of the pixel voltage. A fifth example of the method optionally includes one or more of the first to the fourth examples, and further includes, wherein the pixel voltage between adjacent sensor resets is a monotonic signal superimposed with a noise signal. A sixth example of the method optionally includes one or more of the first to the fifth examples, and further includes sequentially receiving a first digitized compressed pixel voltage and a second digitized compressed pixel voltage from the camera; dark correcting the first digitized compressed pixel voltage and the second digitized compressed pixel voltage; determining a differential compressed pixel voltage by calculating a difference between the dark-corrected first digitized compressed pixel voltage and the dark-corrected second digitized compressed pixel voltage; and generating a differential pixel voltage by adjusting the differential compressed pixel voltage into a valid range, the valid range determined based on a predetermined noise offset and the first threshold voltage. A seventh example of the method optionally includes one or more of the first to the sixth examples, and further includes wherein the valid range is from the noise offset to a sum of the first threshold voltage amplitude and the noise offset.

In one embodiment, a system for acquiring data from a sample comprises a charged particle source for irradiating charged particles towards the sample; a camera for detecting charged particles emitted from the sample responsive to the irradiation, the camera includes an image sensor with multiple pixels and one or more analog-to-digital converters (ADCs), wherein the camera is configured to: convert charged particles impinging a pixel of the multiple pixels into a pixel voltage; compress the pixel voltage into a compressed pixel voltage, wherein the compressed pixel voltage is a difference between the pixel voltage and a first threshold voltage if an amplitude of the pixel voltage is not less than an amplitude of the first threshold voltage and less than an amplitude of a second threshold voltage, and wherein a maximum range of the compressed pixel voltage is not greater than the amplitude of the first threshold voltage, and the maximum range of the compressed pixel voltage is lower than a maximum range of the pixel voltage; digitize the compressed pixel voltage; and output the digitized compressed pixel voltage; an image processor for receiving the digitized compressed pixel voltage from the camera and generating a differential pixel voltage based on the digitized compressed pixel voltage; and a controller for forming an image of the sample based on the differential pixel voltage. In a first example of the system, the system further includes wherein receiving the digitized compressed pixel voltage from the camera and generating the differential pixel voltage based on the compressed pixel voltage includes: sequentially receiving a first digitized compressed pixel voltage and a second digitized compressed pixel voltage; determining a differential compressed pixel voltage by subtracting the first digitized compressed pixel voltage from the second digitized compressed pixel voltage; and generating the differential pixel voltage by adjusting the differential compressed pixel voltage into a valid range, the valid range determined based on a predetermined noise offset and the first threshold voltage. A second example of the system optionally includes the first example and further includes, wherein the digitized compressed pixel voltage and the differential pixel voltage have the same precision.

What is claimed is:

1. A method for acquiring data from a camera including a pixelated image sensor for detecting charged particles, comprising:
   obtaining multiple pixel voltages of a pixel of the image sensor by reading one or more pixels of the image sensor multiple times without resetting the image sensor;
   digitizing each of the multiple pixel voltages into a first number of bits; and
   compressing each of the digitized multiple pixel voltages into a digitized compressed pixel voltage in a second, lower, number of bits, wherein a maximum range of the digitized compressed pixel voltage is less than a maximum range of the pixel voltage, and wherein the digitized compressed pixel voltage is generated by removing at least a most significant bit (MSB) of the digitized pixel voltage.

2. The method of claim 1, wherein the digitized pixel voltage is unsigned.

3. The method of claim 1, further comprising:
   for each pixel of the one or more pixels of the image sensor, sequentially receiving a first digitized compressed pixel voltage and a second digitized compressed pixel voltage;
   determining a differential compressed pixel voltage by calculating a difference between the first digitized compressed pixel voltage and the second digitized compressed pixel voltage; and generating a differential pixel voltage by adjusting the differential compressed pixel voltage to a valid range, wherein the valid range is determined based on a predetermined noise offset and the maximum range of the digitized compressed pixel voltage.

4. The method of claim 3, wherein the valid range is from the noise offset to a sum of a threshold voltage and the noise offset, and the threshold voltage is determined based on the maximum range of the digitized compressed pixel voltage.

5. The method of claim 4, wherein adjusting the differential compressed pixel voltage to the valid range includes adding the threshold voltage to the differential compressed pixel voltage responsive to the differential compressed pixel voltage lower than the noise offset, and subtracting the threshold voltage from the differential compressed pixel voltage responsive to the differential compressed pixel voltage greater than the sum of the threshold voltage and the noise offset.

6. The method of claim 1, wherein the second number of bits is determined based on a maximum range of change in the pixel value between sequential readouts.

7. The method of claim 1, wherein the digitized compressed pixel voltage has a same signal precision as the digitized pixel voltage.

8. The method of claim 1, wherein the digitized compressed pixel voltage is generated by further removing one or more bits from a least significant bit side of the digitized pixel voltage.

9. The method of claim 1, further comprising detecting image sensor overexposure based on the digitized compressed pixel voltage of the one or more pixels of the image sensor.

10. A method for acquiring data from a camera including a pixelated image sensor for detecting charged particles, comprising:

repetitively reading the image sensor without resetting the image sensor to obtain multiple pixel voltages of a pixel of the image sensor;

compressing each of the multiple pixel voltages into a compressed pixel voltage, wherein the compressed pixel voltage is a difference between the pixel voltage and a first threshold voltage responsive to an amplitude of the pixel voltage not less than an amplitude of the first threshold voltage and less than an amplitude of a second threshold voltage, and wherein a range of the compressed pixel voltage is not greater than the amplitude of the first threshold voltage, and the range of the compressed pixel voltage is lower than a range of the pixel voltage;

digitizing the compressed pixel voltage; and outputting the digitized compressed pixel voltage.

11. The method of claim 10, wherein compressing each of the multiple pixel voltages further includes subtracting the second threshold voltage from a particular pixel voltage of the multiple pixel voltages responsive to the amplitude of the pixel voltage not less than the amplitude of the second threshold voltage and less than an amplitude of a third threshold voltage.

12. The method of claim 10, wherein the second threshold voltage is two times of the first threshold voltage.

13. The method of claim 10, further comprising resetting the image sensor after reading the image sensor a predetermined number of times.

14. The method of claim 10, further comprising resetting the image sensor in response to the amplitude of the pixel voltage greater than a maximum pixel voltage amplitude.

15. The method of claim 10, wherein the pixel voltage between adjacent sensor resets is a monotonic signal superimposed with a noise signal.

16. The method of claim 10, further comprising:

sequentially receiving a first digitized compressed pixel voltage and a second digitized compressed pixel voltage from the camera;

dark correcting the first digitized compressed pixel voltage and the second digitized compressed pixel voltage;

determining a differential compressed pixel voltage by calculating a difference between the dark-corrected first digitized compressed pixel voltage and the dark-corrected second digitized compressed pixel voltage; and generating a differential pixel voltage by adjusting the differential compressed pixel voltage into a valid range, the valid range determined based on a predetermined noise offset and the first threshold voltage.

17. The method of claim 16, wherein the valid range is from the noise offset to a sum of the first threshold voltage amplitude and the noise offset.

18. A system for acquiring data from a sample, comprising:

a charged particle source for irradiating charged particles towards the sample;

a camera for detecting charged particles emitted from the sample responsive to the irradiation, the camera includes an image sensor with multiple pixels and one or more analog-to-digital converters (ADCs), wherein the camera is configured to:

convert charged particles impinging a pixel of the multiple pixels into a pixel voltage;

compress the pixel voltage into a compressed pixel voltage, wherein the compressed pixel voltage is a difference between the pixel voltage and a first threshold voltage if an amplitude of the pixel voltage is not less than an amplitude of the first threshold voltage and less than an amplitude of a second threshold voltage, and wherein a range of the compressed pixel voltage is not greater than the amplitude of the first threshold voltage, and the range of the compressed pixel voltage is lower than a range of the pixel voltage;

digitize the compressed pixel voltage; and output the digitized compressed pixel voltage;

an image processor for receiving the digitized compressed pixel voltage from the camera and generating a differential pixel voltage based on the digitized compressed pixel voltage; and a controller for forming an image of the sample based on the differential pixel voltage.

19. The system of claim 18, wherein receiving the digitized compressed pixel voltage from the camera and generating the differential pixel voltage based on the compressed pixel voltage includes:

sequentially receiving a first digitized compressed pixel voltage and a second digitized compressed pixel voltage;

determining a differential compressed pixel voltage by subtracting the first digitized compressed pixel voltage from the second digitized compressed pixel voltage; and generating the differential pixel voltage by adjusting the differential compressed pixel voltage into a valid range, the valid range determined based on a predetermined noise offset and the first threshold voltage.

20. The system of claim 19, wherein the digitized compressed pixel voltage and the differential pixel voltage have a same precision.

* * * * *